US008825432B2

(12) United States Patent
Jiang et al.

(10) Patent No.: US 8,825,432 B2

(45) Date of Patent: Sep. 2, 2014

(54) METHOD FOR ESTIMATING MAXIMUM POWER OF A CIRCUIT AND APPARATUS THEREOF

(75) Inventors: Joe-Air Jiang, Taipei (TW); Jen-Cheng Wang, Taipei (TW); Yu-Li Su, Taipei (TW); Cheng-Long Chuang, Taipei (TW); Tzu-Shiang Lin, Taipei (TW); Jyh-Cherng Shieh, Taipei (TW)

(73) Assignee: National Taiwan University, Taipei (TW)

( * ) Notice: Subject to any disclaimer, the term of this patent is extended or adjusted under 35 U.S.C. 154(b) by 436 days.

(21) Appl. No.: 12/983,852

(22) Filed: Jan. 3, 2011

(65) Prior Publication Data

US 2012/0016529 A1 Jan. 19, 2012

(30) Foreign Application Priority Data

Jul. 15, 2010 (TW) ............................... 99123361 A

(51) Int. Cl.

*G01R 31/00* (2006.01)

*G05F 1/67* (2006.01)

(52) U.S. Cl.

CPC ........................................ *G05F 1/67* (2013.01)

USPC ........................................... 702/117; 700/291

(58) Field of Classification Search

USPC ....................... 702/60, 64-66, 108, 117, 182; 324/76.11

See application file for complete search history.

(56) References Cited

U.S. PATENT DOCUMENTS 5,682,305 A * 10/1997 Kurokami et al. .............. 363/79
7,864,553 B2 * 1/2011 Otaka ............................. 363/60
8,174,281 B2 * 5/2012 Tseng et al. ............. 324/761.01
8,239,149 B2 * 8/2012 Nuotio et al. ................... 702/65
2001/0056530 A1 * 12/2001 Harris ........................... 712/220
2004/0169495 A1 * 9/2004 Yumoto et al. ................ 320/132
2007/0119718 A1 * 5/2007 Gibson et al. ................. 205/637
2007/0181178 A1 * 8/2007 Sohn et al. .................... 136/263
2008/0054909 A1 * 3/2008 Fukuda ......................... 324/429
2010/0006135 A1 * 1/2010 Kim et al. ..................... 136/244
2011/0005572 A1 * 1/2011 Shimizu ........................ 136/244
2011/0056530 A1 * 3/2011 Chang ........................... 136/200
2011/0068817 A1 * 3/2011 Hashimoto et al. ....... 324/761.01
2011/0270546 A1 * 11/2011 Smith ............................. 702/60
2012/0160297 A1 * 6/2012 Yamakawa et al. ........... 136/244
2012/0268087 A1 * 10/2012 Kernahan ...................... 323/234

OTHER PUBLICATIONS

Scarpa, Vladimir V. R. et al. "Low Complexity MPPT Technique Exploiting the Effect of the PV Cell Series Resistance", 23rd Annual IEEE Applied Power Electronics Conference and Exposition, Feb. 24-28, 2008, pp. 1958-1964.

Sefa, Ibrahim et al. "Experimental Study of Interleaved MPPT Converter for PV Systems", 35th Annual IEEE Conference of Industrial Electronics, Nov. 3-5, 2009, pp. 456-461.

* cited by examiner

*Primary Examiner* — Sujoy Kundu
*Assistant Examiner* — Corey Bailey

(57) ABSTRACT

The present invention provides a method for adjusting a maximum power of a circuit having a first voltage output and a first power. The method includes the following steps: (a) obtaining a voltage coefficient by measuring the first power of the circuit and calculating an open-circuit voltage of the first voltage output; (b) estimating an estimated power based on the voltage coefficient; and (c) repeating the steps (a) to (b) for a specific number of times, in which the specific number of times is determined based on a variation of the estimated power during a time period.

20 Claims, 5 Drawing Sheets

METHOD FOR ESTIMATING MAXIMUM POWER OF A CIRCUIT AND APPARATUS THEREOF

FIELD OF THE INVENTION

The present invention relates to a method for estimating the maximum power of a circuit, particularly a method for estimating the voltage, current and current at a maximum power of an equivalent circuit of a solar cell and a load.

BACKGROUND OF THE INVENTION

Silica is the main material in most of the solar cells (or, photovoltaic (PV) cell, PV cell), for it is rich reservation on earth and the mature technology relevant to photovoltaic materials. The photoelectrical energy transformation devices that are made of P-N semiconductor materials directly transfer photo energy to electrical outputs. Sunlight intensity and the temperature of the environment affect the output power of a solar panel.

A solar cell consists of several solar cell units, connected in parallel or in series or in combination thereof, to provide larger voltage or current output. In order to produce a maximum output of the solar cell, one should take advantage of circuit operations such as the method of voltage feedback, the method of power feedback, linear approximation, actual measurement, perturbation and observation method, or other maximum power point tracking (MPPT) methods to look for the best way of operating the solar cell.

Please refer to FIG. 1, which illustrates the relation between the output voltage and the output power of a solar cell. It is observed that the point P indicating the maximum power locates at the top of the curve C1 where the slop is zero. The specification of a solar cell usually includes its open-circuit voltage $V_{oc}$, short-circuit current $I_{sc}$, voltage constant and current constant. Ideally, the voltage at the maximum power output of a solar cell can be calculated by the open-circuit voltage $V_{oc}$ timing the voltage constant, and the current at the maximum power output can be calculated by the short-circuit current $I_{sc}$ timing the current constant. Thus, the maximum power $P_{max}$ can be calculated. The voltage constant and the current constant are based on past experiences and will not changed in accordance with sunlight intensity and the temperature of the environment. Accordingly, the calculated maximum power $P_{max}$ cannot be accurately adjusted due to sunlight intensity and the temperature of the environment. The hereinbefore-mentioned method needs to be assisted with the method of perturbation and observation for adjustment.

The so-called perturbation and observation method is firstly to measure the current output power of a solar cell and secondly to provide a perturbation voltage to either increase or decrease the output power of the solar cell and measures the output power afterwards. If the output power increases, it indicates the perturbation is positive. If the output power decreases, it indicates the perturbation is negative. According to FIG. 1, it can be observed that the slope of the portion of the curve C1 to the left of the point P, says point Q for example, is larger than zero, while the slope of the portion of the curve to the right of the point P, says point R, is less than zero. In other words, when $$\frac{dP_{pv}}{dV_{pv}} > 0,$$

the output voltage $V_{pv}$ needs to be increased to approach the maximum output power $P_{max}$. On the other hand, when $$\frac{dP_{pv}}{dV_{pv}} < 0,$$

the output voltage $V_{pv}$ needs to be decreased to approach the maximum output power $P_{max}$. Finally, when $$\frac{dP_{pv}}{dV_{pv}} = 0,$$

the power output of the solar cell has reached its maximum power $P_{max}$.

The method of perturbation and observation requires less number of parameters to be measured, which is an advantage thereof. However, the method of perturbation and observation may result in shifting back and forth near the point P of maximum power, which could causes energy loss and reduction in terms of energy transfer efficiency. Therefore, if there exists a method for rapidly as well as accurately estimating the voltage at maximum power output before the implementation of the method of perturbation and observation, not only the energy loss can be reduced but also the maximum power of the solar cell can be rapidly achieved.

SUMMARY OF THE INVENTION

To overcome the abovementioned drawback, the present invention provides a method for adjusting a maximum power of a circuit having a first voltage output and a first power. The method includes the following steps: (a) obtaining a voltage coefficient by measuring the first power of the circuit and calculating an open-circuit voltage of the first voltage output; (b) estimating an estimated power based on the voltage coefficient; and (c) repeating the steps (a) to (b) for a specific number of times, in which the specific number of times is determined based on a variation of the estimated power during a time period.

In accordance with another aspect of the present invention, a method for evaluating a voltage value at a maximum power of a circuit having a first voltage output and a first power is provided. The method includes steps of obtaining a voltage coefficient by measuring the first power and calculating the first voltage output and estimating the voltage value at the maximum power of the circuit based on the voltage coefficient.

In accordance with a further aspect of the present invention, a system for evaluating a voltage value at a maximum power of a circuit is provided. The circuit has a first voltage output and a first power. The system has a measurement unit and a processing unit. The measurement unit measures the first power. The processing unit obtains a voltage coefficient by using the first power and calculating the first voltage output, and estimates the voltage value at the maximum power of the circuit based on the voltage coefficient.

The above objects and advantages of the present invention will be more readily apparent to those ordinarily skilled in the art after reading the details set forth in the descriptions and drawings that follow, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 2A:
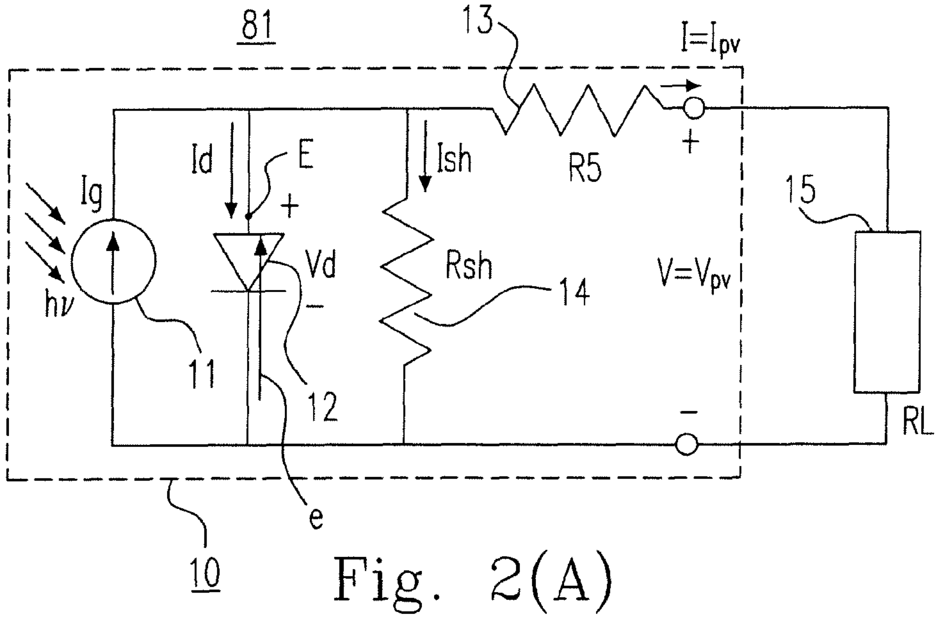
FIG. 2(A) is a schematic diagram showing a solar energy transfer circuit in accordance with one embodiment of the present invention.

Please refer to FIG. 2(A), which illustrates a solar energy transfer circuit in accordance with one embodiment of the present invention. The solar energy transfer circuit 81 includes an equivalent circuit 10 of a solar cell (not shown) and a load 15. The equivalent circuit 10 has a photoelectrical current source 11, a diode 12, a serially connected resistor 13 and a resistor 14 connected in parallel. The load 15 is coupled to the equivalent circuit 10. In the illustrations of FIG. 2(A), the I denotes the loading current, the V denotes the loading voltage, the $R_s$ denotes the resistance of the resistor 13, the $R_{sh}$ denotes the resistance of the resistor 14, the $I_{sh}$ denotes the current flows through the resistor 14, $I_d$ denotes the current in the diode 12, the $V_d$ denotes the voltage at the diode 12, the $V_{pv}$ denotes the output voltage of the solar cell, the $I_{pv}$ denotes the output current of the solar cell, and $R_L$ denotes the resistance of the load 15.

The solar cell (not shown) is illuminated by a light having the energy hv and generates a current $I_g$. According to the Kirchhoff's Current Law, it can be derived that $I=I_g-I_d-I_{sh}$. And based on the Ohm's law, $$I_{sh} = \frac{V_d}{R_{sh}}.$$

Thus, it can be derived that:

$$I = I_g - I_d - \frac{V_d}{R_{sh}} \tag{1}$$

According to the Kirchhoff's Voltage Law, it can be derived that:

$$V_d=V+R_sI \tag{2}$$

According to the PN diode model, the relation between the diode current Id and the diode voltage $V_d$ can be found:

$$I_d = I_{sat}\left\{\exp\left[\frac{qV_d}{nkT}\right] - 1\right\} \tag{3}$$

In equation (3), $I_{sat}$ denotes the reverse saturation current, q the electric quantity carried by an electron, n the ideal parameter of a diode (between 1 and 2), k the Boltzmann constant.

In FIG. 2(*a*), the output current of the solar cell $I=I_{pv}$, and the output voltage of the solar cell $V=V_{pv}$. Substituting equations (2) and (3) into equation (1), one can get:

$$I = I_{pv} = I_g - I_{sat}\left\{\exp\left[\frac{q(V_{pv}+I_{pv}R_s)}{nkT}\right] - 1\right\} - \frac{V+R_sI}{R_{th}} \tag{4}$$

In real practices, the resistance $R_{sh}$ is due to a small portion of the current $I_g$ bypasses to a P-N depletion region or die boundary. Thus, the value of the resistance $R_{sh}$ is quite large. So the equation (4) can be simplified to:

$$I = I_{pv} = I_g - I_{sat}\left\{\exp\left[\frac{q(V_{pv}+I_{pv}R_s)}{nkT}\right] - 1\right\} \tag{5}$$

The resistance $R_s$, is due to carriers pass the route e to arrive at the electrode E via semiconductor area. The value of the resistance $R_s$ can be determined by the process technology, which can be obtained from the specification of the solar cell provided by the manufacturer.

Again, please refer to FIG. 1, the location that the maximum power occurs is at the point P where the slope of the curve C1 is zero. The slope of the curve C1 is defined as $$\beta = \frac{dP_{pv}}{dVpv}.$$

For $P_{pv}=I_{pv}\times V_{pv}$, and I is a function of V, so $$\beta = \frac{dP_{pv}}{dV_{pv}} = \frac{d(I_{pv}V_{pv})}{dV_{pv}} = I_{pv} * \frac{dV_{pv}}{dV_{pv}} + \frac{dI_{pv}}{dV_{pv}} * V_{pv} = I_{pv} + \frac{dI_{pv}}{dV_{pv}} * V_{pv} \tag{6}$$

In the equation (5), one may let the $I_{pv}$ differentiated by the $V_{pv}$ and get:

$$\frac{dIpv}{dVpv}=-\frac{qI_{sat}}{nkT}\exp\left[\frac{q(Vpv+IR_s)}{nkT}\right]\left(1+\frac{dIpv}{dVpv}*R_s\right) \tag{7}$$

Substituting equations (5) and (7) into (6), one may obtain $$\beta=I_{pv}+\frac{dI_{pv}}{dV_{pv}}*V_{pv}=I_g-I_{sat}\left\{\exp\left[\frac{q(V_{pv}+I_{pv}R_s)}{nkT}\right]-1\right\}-\frac{qI_{sat}}{nkT}\exp\left[\frac{q(V_{pv}+IR_s)}{nkT}\right]\left(1+\frac{dI_{pv}}{dV_{pv}}*R_s\right)V_{pv} \tag{8}$$

To estimate the maximum power $P_{max}$, let $\beta=0$. The equation (8) can be simplified to:

$$I_g+I_{sat}=I_{sat}*\exp\left[\frac{q(V_{mp}+I_{mp}R_s)}{nkT}\right]\left(1+\frac{qV_{mp}}{nkT}+\frac{qV_{mp}R_s}{nkT}*\frac{dI_{pv}}{dV_{pv}}\bigg|_{V_{pv}=V_{mp}}\right) \tag{9}$$

Or, $$\frac{I_g+I_{sat}}{I_{sat}}=\exp\left[\frac{q(V_{mp}+I_{mp}R_s)}{nkT}\right]\left(1+\frac{qV_{mp}}{nkT}+\frac{qV_{mp}R_s}{nkT}*\frac{dI_{pv}}{dV_{pv}}\bigg|_{V_{pv}=V_{mp}}\right) \tag{10}$$

Where the $V_{mp}$ denotes the estimated voltage near the point P having the maximum power, and $I_{mp}$ the estimated current thereof.

To determine the relation between the estimated voltage $V_{mp}$ and the open-circuit voltage $V_{oc}$, firstly let the $I_{pv}=0$ and $V_{pv}=V_{oc}$, and one may have $$\frac{I_g+I_{sat}}{I_{sat}}=\exp\left[\frac{qV_{oc}}{nkT}\right] \tag{11}$$

Or, the open-circuit voltage $$V_{oc}=\frac{nkT}{q}\ln\left[\frac{I_g+I_{sat}}{I_{sat}}\right] \tag{12}$$

In general, the value of the open-circuit voltage $V_{oc}$ is indicated in the specification of a battery or a cell under standard test conditions; irradiation intensity of 1000 W/m$^2$; AM 1.5G; and temperature of 25° C. The open-circuit voltage $V_{oc}$ and the short-circuit current $I_{sc}$ are measured from the equivalent circuit 10 of a solar cell under a specific temperature and radiation condition. When the load 15 is under an open-circuit condition, the equivalent circuit 10 provides a first voltage to the load 15. The first voltage is an open-circuit voltage $V_{oc}$. When the load 15 is under a short-circuit condition, the equivalent circuit 10 provides a first current, to the load 15. The first current is a short-circuit current $I_{sc}$.

The relation between the estimated voltage $V_{mp}$ and the open-circuit voltage $V_{oc}$ can be derived from equations (10) and (11):

$$\left(1+\frac{qV_{mp}}{nkT}+\frac{qI_{mp}R_s}{nkT}*\frac{dI_{pv}}{dV_{pv}}\bigg|V_{pv}=V_{mp}\right)=\exp\left[\frac{q}{nkT}(V_{oc}-V_{mp}-I_{mp}R_s)\right] \tag{13}$$

Figure 2B:
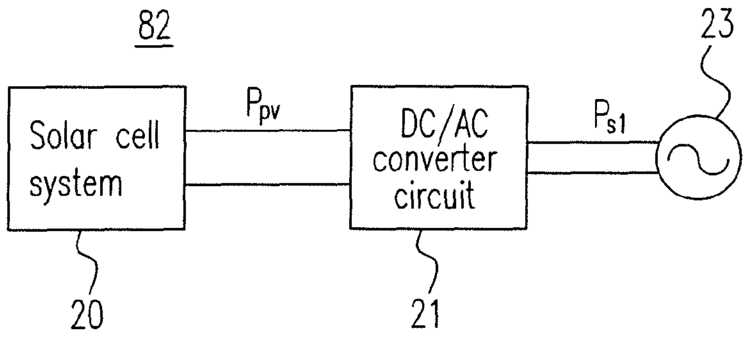
FIG. 2(B) is a schematic diagram showing a PV DC/AC converter circuit according to an embodiment of the present invention.

Please refer to FIG. 2(B), which illustrates a PV DC/AC converter circuit according to an embodiment of the present invention. The PV DC/AC converter circuit 82 has a solar cell system 20, a DC/AC converter circuit 21 and a utility power 23. The solar cell system 20 consists at least one equivalent circuit 10 being connected either in series or in parallel. The power generated by the solar cell system 20 can be converted into utility power via the DC/AC converter circuit 21. The power efficiency $$P_{s1}=V_s*I_s*\cos\theta=V_s*I_T=\eta P_{pv}=I_{pv}*V_{pv},\text{ thus }I_{pv}=(V_s*I_T)/\eta V_{pv} \tag{14}$$

Where the $V_s$ is the root mean square of linear voltage, the $I_s$ is the root mean square of the linear current, θ the angle between the linear voltage vector and the linear current vector, and $I_T$ the value of the linear current.

Figure 2C:
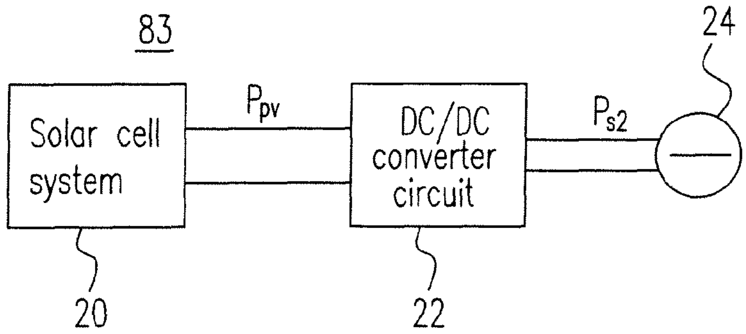
FIG. 2(C) is a schematic diagram showing a PV DC/DC converter circuit according to an embodiment of the present invention.

Please refer to FIG. 2(C), which illustrates a PV DC/DC converter circuit according to an embodiment of the present invention. The PV DC/DC converter circuit 83 has a solar cell system 20, a DC/DC converter circuit 22 and a utility power 24. The power generated by the solar cell system 20 can be converted to a utility power $P_{s2}$ via the DC/DC converter circuit 22.

On the other hand, the output power $P_{pv}$ of the equivalent circuit 10 of the solar cell is a DC power. $P_{pv}=I_{pv}*V_{pv}$ (15)

During the power converting, some of the energy is dissipated via a form of heat. Therefore, the relation between the output power $P_{pv}$ and the power efficiency $P_s$ is:

$$\eta P_{pv}=P_s \tag{16}$$

Substituting equations (14) and (15) into (16), one may obtain:

$$\eta I_{pv}*V_{pv}=V_s*I_T,\text{ thus }I_{pv}=(V_s*I_T)/\eta V_{pv} \tag{17}$$

Accordingly the output current of the solar cell $I_{pv}$ can be obtained without direct measurement using a DC current sensor.

In equation (13), $I_{mp}=I_{pv}=(V_s*I_T)/\eta V_{mp}$ and $$\left(\frac{dI_{pv}}{dV_{pv}}\bigg|V_{pv}=V_{mp}\right)=-(V_sI_T)/(\eta V_{mp}^2).$$

Substituting the two equation into equation (13):

$$1+\frac{q}{nkT}V_{mp}-\frac{q}{nkT}\left(\frac{V_sI_T}{\eta V_{mp}}\right)R_s=\exp\left[\frac{q}{nkT}\left(V_{oc}-V_{mp}-\frac{V_sI_T}{\eta V_{mp}}R_s\right)\right] \tag{18}$$

The power efficiency $P_s=V_s*I_T$ in the equation (14) can be obtained by measurement, so there is only one variable which is $V_{mp}$ in the equation (18). To solve for the estimation voltage $V_{mp}$ near the maximum power of the circuit, one may assume the estimation voltage $V_{mp}$ is a multiple of the open-circuit voltage $V_{oc}$, i.e., $V_{mp}=mV_{oc}$. Substituting the $mV_{oc}$ into the equation (18), one may obtain:

$$1+\frac{q}{nkT}V_{mp}-\frac{q}{nkT}\left(\frac{V_s I_T}{\eta m V_{oc}}\right)R_s=\exp\left[\frac{q}{nkT}\left(V_{oc}V_{mp}-\frac{V_s I_T}{\eta m V_{oc}}R_s\right)\right] \tag{19}$$

Figure 1:
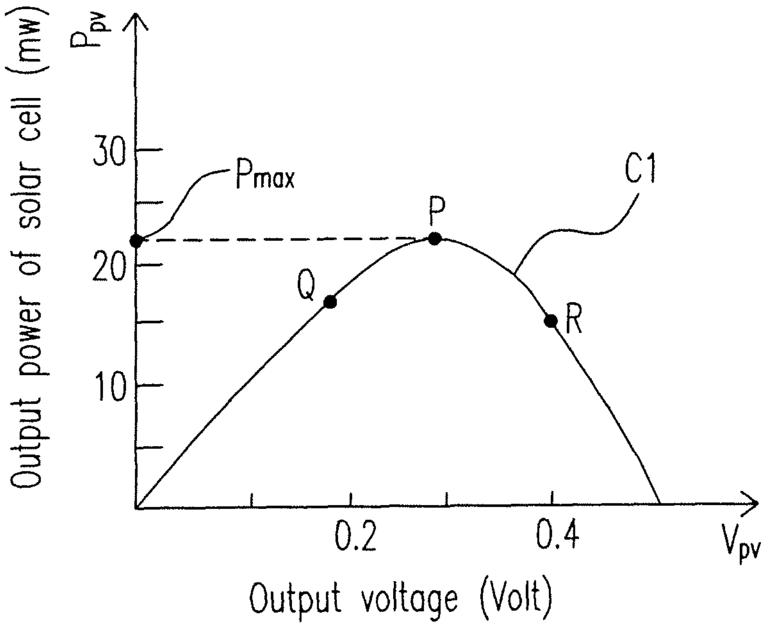
Fig. 1(Prior Art)
FIG. 1 is a schematic diagram illustrating the relation between the output voltage and the output power of a solar cell, according to the common knowledge know to the art.

The value of m can be obtained by solving the equation (19), and then the estimation voltage near the maximum power of the circuit is obtained. Of course, the estimation voltage $V_{mp}$ can be obtained based on the curve C1 illustrated in FIG. 1. The value at the vertical axis corresponding to the estimation voltage $V_{mp}$ is the power near the maximum power point. Noted that the curve C1 in FIG. 1 is subject to the materials of the solar cell.

In short, the abovementioned method for evaluating the estimation voltage at the maximum power of an equivalent circuit 10 of a solar cell is summarized as below. The equivalent circuit 10 of a solar cell has an open-circuit voltage $V_{oc}$ and an output power $P_{pv}$. The output power $P_{pv}$ of the solar cell is converted into a first output power $P_s$ via a DC/DC converter circuit 22 or a DC/AC converter circuit 21. The method includes the following steps: Firstly, according to equations (16) to (19), the present invention takes advantages of the measurement of the first power Ps and the calculation of the open-circuit voltage $V_{oc}$ to obtain a voltage coefficient m. Secondly, the present invention evaluates the estimation voltage $V_{mp}$ at the maximum power $P_{max}$ based on the voltage coefficient m. Then, the solar cell is operated toward the condition at the maximum power of the circuit so that the solar cell is generating the maximum output power.

In general, the error of the estimation power $P_{max}$ made by the abovementioned method is very small or even close to zero. If there exist an error, one may adopt a method of perturbation and observation to obtain accurate value of the maximum power $P_{max}$.

Figure 2D:
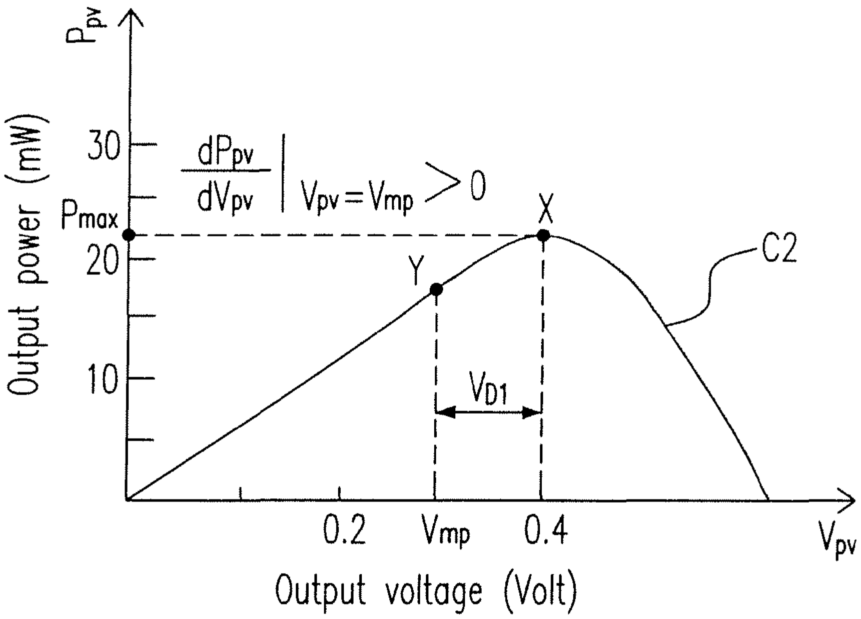
FIGS. 2(D) and 2(E) are schematic diagrams showing the method of perturbation and observation.
Figure 2E:
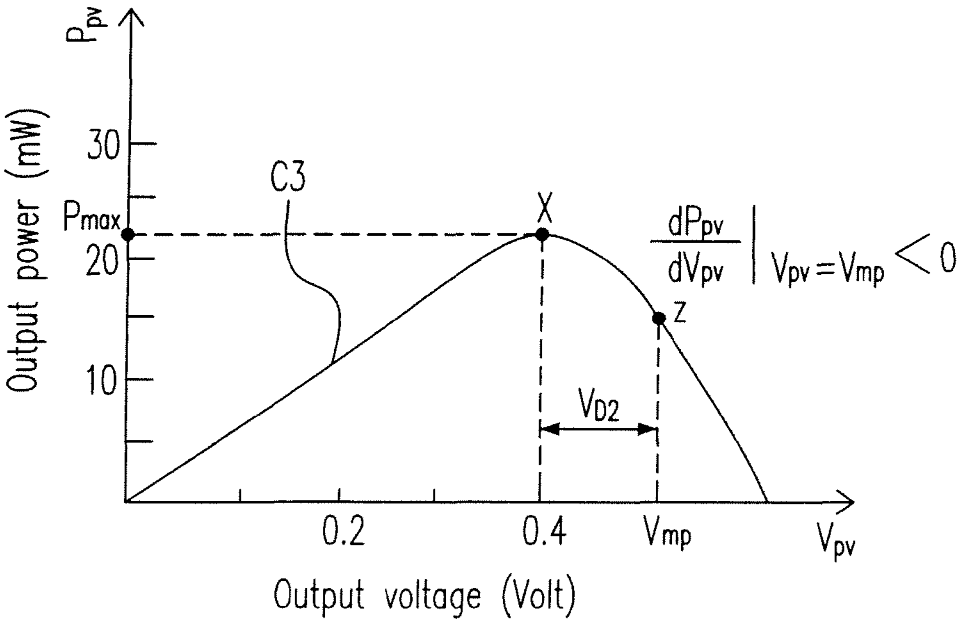

Please refer to FIGS. 2(D) and 2(E), which schematics the method of perturbation and observation known to the art. The fundamental steps of the method of perturbation and observation have described in the prior paragraphs so there is no need to repeat. FIG. 2(D) illustrates a condition when the slope of the curve C2 at a point Y is larger than zero, or, $$\left.\frac{dP_{pv}}{dV_{pv}}\right|V_{pv}=V_{mp}$$

is larger than zero, a first perturbation voltage $V_{D1}$ is applied to the load 15 to increase the output voltage $V_{pv}$. On the other hand, FIG. 2(E) illustrates a condition when the slope of the curve C3 at a point Z is less than zero, or, $$\left.\frac{dP_{pv}}{dV_{pv}}\right|V_{pv}=V_{mp}$$

is less than zero, a second perturbation voltage $V_{D2}$ is applied to the load 15 to decrease the output voltage $V_{pv}$.

A second embodiment of the present invention of evaluating method takes advantages of the abovementioned method to obtain the estimation voltage $V_{mp}$, and then to calculate the estimation current Imp and the maximum power $P_{max}$. Substituting the $V_{pv}$, in the equation (17) with the estimation voltage $V_{mp}$, one may obtain the estimation current $I_{mp}$. Therefore, the second embodiment of the present invention includes the following steps: Firstly, according to equations (16) to (19), the present invention takes advantages of the measurement of the first power $P_s$ and the calculation of the open-circuit voltage $V_{oc}$ to obtain a voltage coefficient m. Secondly, the present invention evaluates an estimation current $I_{mp}$ based on the voltage coefficient m, the open-circuit voltage $V_{oc}$ and the first power $P_s$. Thirdly, the maximum power $P_{max}$ is evaluated based on the estimation current $I_{mp}$ and the estimation voltage $V_{mp}$.

The methods as mentioned hereinbefore are derived based on the fundamental concepts of circuit such as KVL and KCL and related formulas of diode components. That is to say, any circuit complied with the component characteristics of the mentioned diode 12 and the equivalent circuit 10 is applicable to the above-mentioned methods for estimating the maximum power $P_{max}$. Examples of the solar cell include, but not limited to, an organic solar cell, a thin-film solar cell and a dye-sensitized solar cell. Preferably, the solar cell comprises a material including one selected from a group consisting of a monocrystalline silicon, a polycrystalline silicon, an amorphous silicon, a II-VI semiconductor and a III-V semiconductor.

Figure 3A:
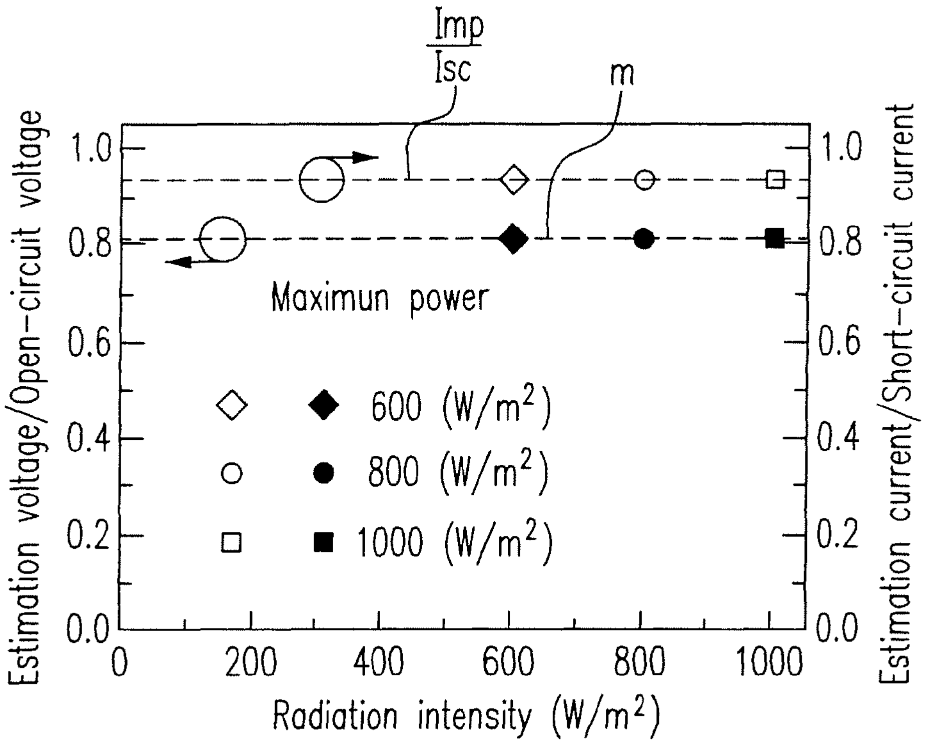
FIG. 3(A) is a schematic diagram showing the voltage coefficient m and the ratio of the estimation current $I_{mp}$ over the short-circuit current $I_{sc}$ under conditions of different radiation intensities.

Please refer to FIG. 3(A), which schematics the voltage coefficient m and the ratio of the estimation Imp over the short-circuit current $I_{sc}$ under conditions of different radiation intensities. It can be observed that the voltage coefficient m slightly increases as the radiation intensity increases. Therefore, the voltage coefficient m and the radiation intensity are positively correlated. However, the ratio of the estimation current $I_{mp}$ over the short-circuit current $I_{sc}$, $I_{mp}/I_{sc}$, remains barely unchanged as the radiation intensity increases.

Figure 3B:
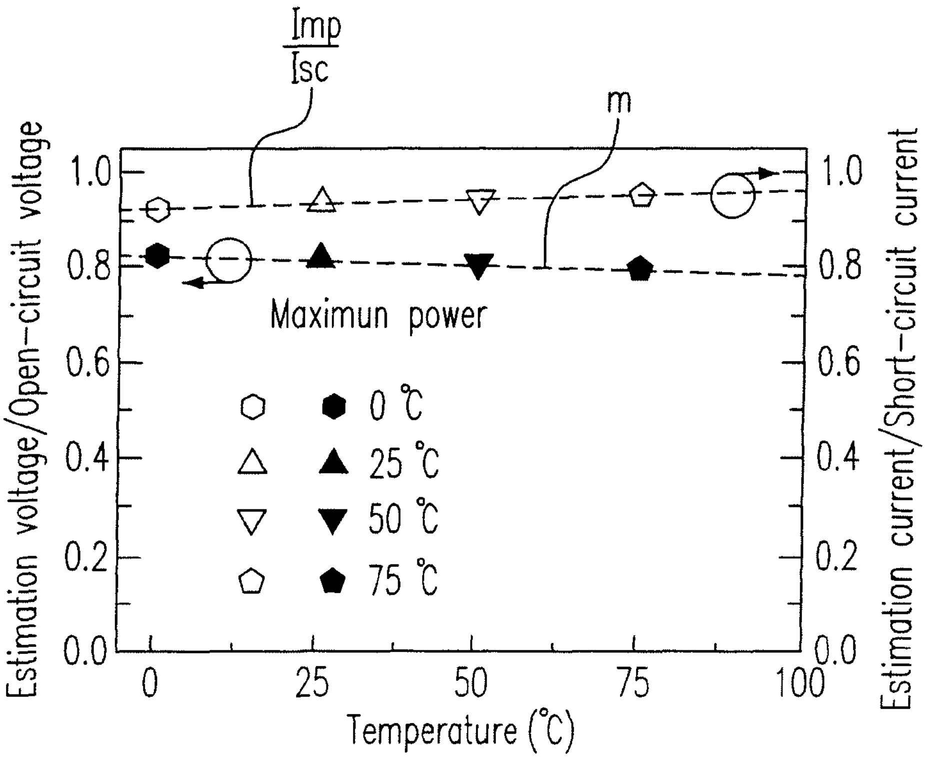
FIG. 3(B) is a schematic diagram showing the voltage coefficient m and the ratio of the estimation current $I_{mp}$ over the short-circuit current $I_{sc}$ under conditions of different temperatures.

Please refer to FIG. 3(B), which schematics the voltage coefficient m and the ratio of the estimation Imp over the short-circuit current $I_{sc}$ under conditions of different temperatures. It can be observed that the voltage coefficient m slightly decreases as the temperature increases. Therefore, the voltage coefficient m and the temperature are negatively correlated. However, the ratio of the ratio of the estimation current $I_{mp}$ over the short-circuit current $I_{sc}$, $I_{mp}/I_{sc}$, slightly increases as the temperature increases. Therefore, the ratio $I_{mp}/I_{sc}$ and the temperature are positively correlated.

In the first and second embodiments of the present invention, the voltage coefficient m is obtained by real-time calculation. If the variation of the radiation intensity is large, it must results in a large variation of the maximum power $P_{max}$. It is applicable to increase the frequency of calculating the voltage coefficient m when the maximum power $P_{max}$ varies fiercely during a certain period of time, and reduce the mentioned frequency when the variation of the maximum power $P_{max}$ is relatively small during the period of time, which is the third embodiment of the present invention for adjusting the equivalent circuit 10 of a solar cell to a maximum power. According to the third embodiment, the estimation voltage $V_{mp}$ is timely obtained by the equation $V_{mp}=m*V_{oc}$, after calculating the voltage coefficient m. Certainly, the method of perturbation and observation can be also adopted afterwards, to improve the accuracy of the estimation of the maximum power $P_{max}$.

Figure 4:
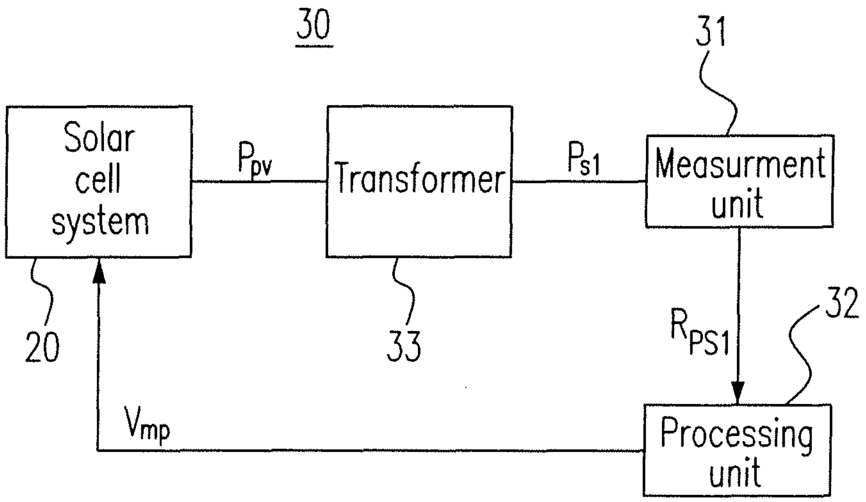
FIG. 4 is a schematic diagram of a hardware structure for adjusting a maximum power of a solar cell according to the present invention.

Please refer to FIG. 4, which schematics a hardware structure for adjusting a maximum power of a solar cell according to the present invention. The hardware structure 30 includes a solar cell system 20, a converter 33, a measurement unit 31 and a processing unit 32. The solar cell system 20 outputs PV energy having a power $P_{pv}$. The converter 33 converts DC currents to either DC or AC currents, and converts the PV energy having a power $P_{pv}$ to a first output power $P_{s1}$. The measurement unit 31 detects a variation $R_{PS1}$ of the first output power $P_{s1}$ during a time unit, and submits the variation $R_{PS1}$ to the processing unit 32. The processing unit 32 receives the variation $R_{PS1}$. When the value of the variation $R_{PS1}$ is larger or equal to a standard value, the processing unit 32 increases the frequency of calculation. When the variation $R_{PS1}$ is less than the standard value, the processing unit 32 reduce the frequency of calculation. The standard depends on the use of material. Preferably, the standard is set between 5 to 10 watts. The frequency of calculation is based on the variation of the first power $P_{s1}$ in each second. For example, when the variation of the first power $P_{s1}$ in one second is less than 5 watts, the frequency of calculation is set at 1 per second. When the variation of the first power $P_{s1}$ is larger than 5 watts per second, the calculation frequency is set to twice a second, and when the variation of the first power $P_{s1}$ is larger than 10 watts per second, the calculation frequency is set to 3 per second. The processing unit 32 transmits the estimation voltage $V_{mp}$ to the solar cell system 20 to adjust the output power $P_{pv}$, after estimating the value of the estimation voltage $V_{mp}$.

According to the first embodiment of the present invention, a method for evaluating a voltage value at a maximum power of a circuit having a first voltage output and a first power is provided. The method includes steps of obtaining a voltage coefficient by measuring the first power and calculating the first voltage output and estimating the voltage value at the maximum power of the circuit based on the voltage coefficient.

Preferably, the circuit comprises an equivalent circuit of a solar cell and a load.

Preferably, the solar cell comprises one selected from a group consisting of an organic solar cell, a thin-film solar cell and a dye-sensitized solar cell.

Preferably, the solar cell comprises a material including one selected from a group consisting of a monocrystalline silicon, a polycrystalline silicon, an amorphous silicon, a II-VI semiconductor and a III-V semiconductor.

Preferably, the voltage value is estimated by multiplying an open-circuit value of the first voltage output by the voltage coefficient, and the voltage coefficient is obtained by a calculation using the open-circuit value and the measured first power.

Preferably, the voltage coefficient is affected by one of an external radiation and a temperature.

Preferably, the method further includes a step of adopting a perturbation and observation method to achieve the maximum power of the circuit.

Preferably, the method further includes steps of estimating an estimation current based on the voltage coefficient, an open-circuit voltage of the first voltage output and the first power and estimating the maximum power of the circuit based on the estimation current and the open-circuit voltage of the first voltage output.

Preferably, the circuit comprises an equivalent circuit of a solar cell and a load and provides the first voltage output to the load when the load is on an open-circuit condition, and the circuit provides a first current to the load when the load is on a short-circuit condition.

Preferably, the circuit has an estimation voltage by multiplying the open-circuit voltage of the first voltage output by the voltage coefficient. Preferably, the voltage coefficient is obtained by a calculation using the open-circuit voltage and the measured first power and is affected by one of an external radiation and a temperature.

According to the second embodiment of the present invention, a method for adjusting a maximum power of a circuit having a first voltage output and a first power is provided. The method includes the following steps: (a) obtaining a voltage coefficient by measuring the first power of the circuit and calculating an open-circuit voltage of the first voltage output; (b) estimating an estimated power based on the voltage coefficient; and (c) repeating the steps (a) to (b) for a specific number of times, in which the specific number of times is determined based on a variation of the estimated power during a time period.

Preferably, the circuit is coupled to a measurement unit and a processing unit, the measurement unit detects the variation of the estimated power during the time period.

Preferably, the processing unit increases the specific number of times when the variation has one of two values being respectively larger than and equal to a standard value, and the process unit decreases the specific number of times when the variation is less than the standard value.

Preferably, the method further includes a step of adopting a perturbation and observation method to achieve the maximum power of the circuit.

According to the third embodiment of the present invention, of the present invention, a system for evaluating a voltage value at a maximum power of a circuit is provided. The circuit has a first voltage output and a first power. The system has a measurement unit and a processing unit. The measurement unit measures the first power. The processing unit obtains a voltage coefficient by using the first power and calculating the first voltage output, and estimates the voltage value at the maximum power of the circuit based on the voltage coefficient.

Preferably, the circuit comprises an equivalent circuit of a solar cell and a load, and provides the first voltage output to the load when the load is on an open-circuit condition, and the circuit provides a first current to the load when the load is on a short-circuit condition.

Based on the above, the present invention provides a simple strategy for generating switching signals of multi-phase-and-multi-level voltage source inverters, which is not limited to the types of the input signal or the loading. For arbitrary number of phases of voltage source inverter, the present invention is able to simultaneously generate a switching signal for each of the switches in the system, and allows the average voltage responding to the loading equal to the input voltage. While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims that are to be accorded with the broadest interpretation so as to encompass all such modifications and similar structures.

What is claimed is:

1. A method for adjusting a maximum power of a circuit having a first voltage output and a first power, comprising steps of:

(a) providing a processing unit;

(b) converting the first power of the circuit to a first output power;

(c) obtaining a voltage coefficient in real-time by measuring the first output power free from a current sensor and calculating an open-circuit voltage of the first voltage output;

(d) estimating an estimated power based on the voltage coefficient by the processing unit; and (e) repeating the steps (b) to (d) with a specific calculation frequency, wherein the specific calculation frequency is determined based on a variation of the first output power during a time period.

2. A method as claimed in claim 1, wherein the circuit is coupled to a measurement unit and the processing unit, and the measurement unit detects the variation of the first output power during the time period.

3. A method as claimed in claim 2, wherein:

the processing unit increases the specific calculation frequency when the variation is larger than or equal to a standard value; and the process unit decreases the specific calculation frequency when the variation is less than the standard value.

4. A method as claimed in claim 1, further comprising a step of:

adopting a perturbation and observation method to achieve the maximum power of the circuit.

5. A method for evaluating a voltage value at a maximum power of a circuit having a first voltage output and a first power, comprising steps of:

providing a processing unit;

converting the first power of the circuit to obtain a first output power;

obtaining a voltage coefficient in real-time by measuring the first output power free from a current sensor and calculating the first voltage output; and estimating the voltage value at the maximum power of the circuit based on the voltage coefficient by the processing unit by using different calculation frequencies based on a variation of the first output power.

6. A method as claimed in claim 5, wherein the circuit comprises an equivalent circuit of a solar cell and a load.

7. A method as claimed in claim 6, wherein the solar cell comprises one selected from a group consisting of an organic solar cell, a thin-film solar cell and a dye-sensitized solar cell.

8. A method as claimed in claim 5, wherein the solar cell comprises a material including one selected from a group consisting of a monocrystalline silicon, a polycrystalline silicon, an amorphous silicon, a II-VI semiconductor and a III-V semiconductor.

9. A method as claimed in claim 5, wherein the voltage value is estimated by multiplying an open-circuit value of the first voltage output by the voltage coefficient.

10. A method as claimed in claim 9, wherein the voltage coefficient is obtained by a calculation using the open-circuit value and the measured first output power.

11. A method as claimed in claim 5, wherein the voltage coefficient is affected by one of an external radiation and a temperature.

12. A method as claimed in claim 5, further comprising:

adopting a perturbation and observation method to achieve the maximum power of the circuit.

13. A method as claimed in claim 5, further comprising steps of:

estimating an estimation current based on the voltage coefficient, an open-circuit voltage of the first voltage output and the first output power; and estimating the maximum power of the circuit based on the estimation current and the open-circuit voltage of the first voltage output.

14. A method as claimed in claim 13, wherein the circuit comprises an equivalent circuit of a solar cell and a load.

15. A method as claimed in claim 14, wherein the circuit provides the first voltage output to the load when the load is on an open-circuit condition, and the circuit provides a first current to the load when the load is on a short-circuit condition.

16. A method as claimed in claim 13, wherein the circuit has an estimation voltage by multiplying the open-circuit voltage of the first voltage output by the voltage coefficient.

17. A method as claimed in claim 16, wherein the voltage coefficient is obtained by a calculation using the open-circuit voltage and the measured first output power.

18. A method as claimed in claim 13, wherein the voltage coefficient is affected by one of an external radiation and a temperature.

19. A system for evaluating a voltage value at a maximum power of a circuit, wherein the circuit has first voltage output and a first power, comprising:

a converting unit converting the first power into a first output power;

a measurement unit measuring the first output power free from a current sensor and a processing unit obtaining a voltage coefficient by using the first output power and calculating the first voltage output, and estimating the voltage value at the maximum power of the circuit based on the voltage coefficient by using different calculation frequencies based on a variation of the first output power.

20. A system as claimed in claim 19, wherein the circuit comprises an equivalent circuit of a solar cell and a load, and provides the first voltage output to the load when the load is on an open-circuit condition, and the circuit provides a first current to the load when the load is on a short-circuit condition.

* * * * *